United States Patent [19]
Nimmersjö

[11] Patent Number: 4,719,580
[45] Date of Patent: Jan. 12, 1988

[54] DETECTION AND LOCATION OF A FAULT POINT BASED ON A TRAVELLING WAVE MODEL OF THE HIGH VOLTAGE TRANSMISSION LINE

[75] Inventor: Gunnar Nimmersjö, Västeras, Sweden

[73] Assignee: ASEA Aktiebolag, Västeras, Sweden

[21] Appl. No.: 743,930

[22] Filed: Jun. 12, 1985

[30] Foreign Application Priority Data

Jun. 15, 1984 [SE] Sweden .................. 8403226

[51] Int. Cl.$^4$ .............. G01R 31/08; G01R 19/00; G06F 15/31
[52] U.S. Cl. .................. 364/483; 324/512; 364/480
[58] Field of Search ............ 364/483, 487; 324/52, 324/509, 512, 522, 532, 533, 534, 480

[56] References Cited

U.S. PATENT DOCUMENTS

| | | | |
|---|---|---|---|
| 3,244,975 | 4/1966 | Bauer | 324/52 |
| 3,710,240 | 1/1973 | Vuehnemann et al. | 324/52 |
| 3,878,460 | 4/1975 | Nimmersjo | 324/52 |
| 3,931,502 | 1/1976 | Vohlas | 324/52 |
| 4,063,163 | 12/1977 | Vitins | 324/52 |
| 4,151,459 | 4/1979 | Fayolle et al. | 324/52 |
| 4,314,199 | 2/1982 | Yamaura et al. | 324/52 |
| 4,471,294 | 9/1984 | Nielsen | 324/52 |
| 4,527,113 | 4/1985 | Hillerich | 324/52 |
| 4,559,491 | 12/1985 | Saha | 364/492 |
| 4,560,922 | 12/1985 | Heller et al. | 324/52 |

Primary Examiner—Errol A. Krass
Assistant Examiner—Daniel W. Juffernbruch
Attorney, Agent, or Firm—Watson, Cole, Grindle & Watson

[57] ABSTRACT

A method and a device for distance protection and location of a fault point on a transmission line based on voltage waves emitted from a measuring point towards a fault point and corresponding waves reflected from a fault point, which are included in a travelling wave model of a transmission line. At certain regular intervals, a measurement is effected of the instantaneous values of the current and the voltage at an end point of the transmission line, for example at a station. Based on these measured values, and with the aid of the travelling wave model, it is possible to calculate the voltage at a number of control points along the transmission line. If the line is energized and the calculated control voltages at two control points have different signs during a time longer than a time corresponding to normal phase difference between the two voltages, there is a fault on the line between these points. By interpolation, it is possible, based on the distance between the points in question and the calculated control voltages, to precisely locate the fault point in the case of a low resistance fault.

12 Claims, 8 Drawing Figures

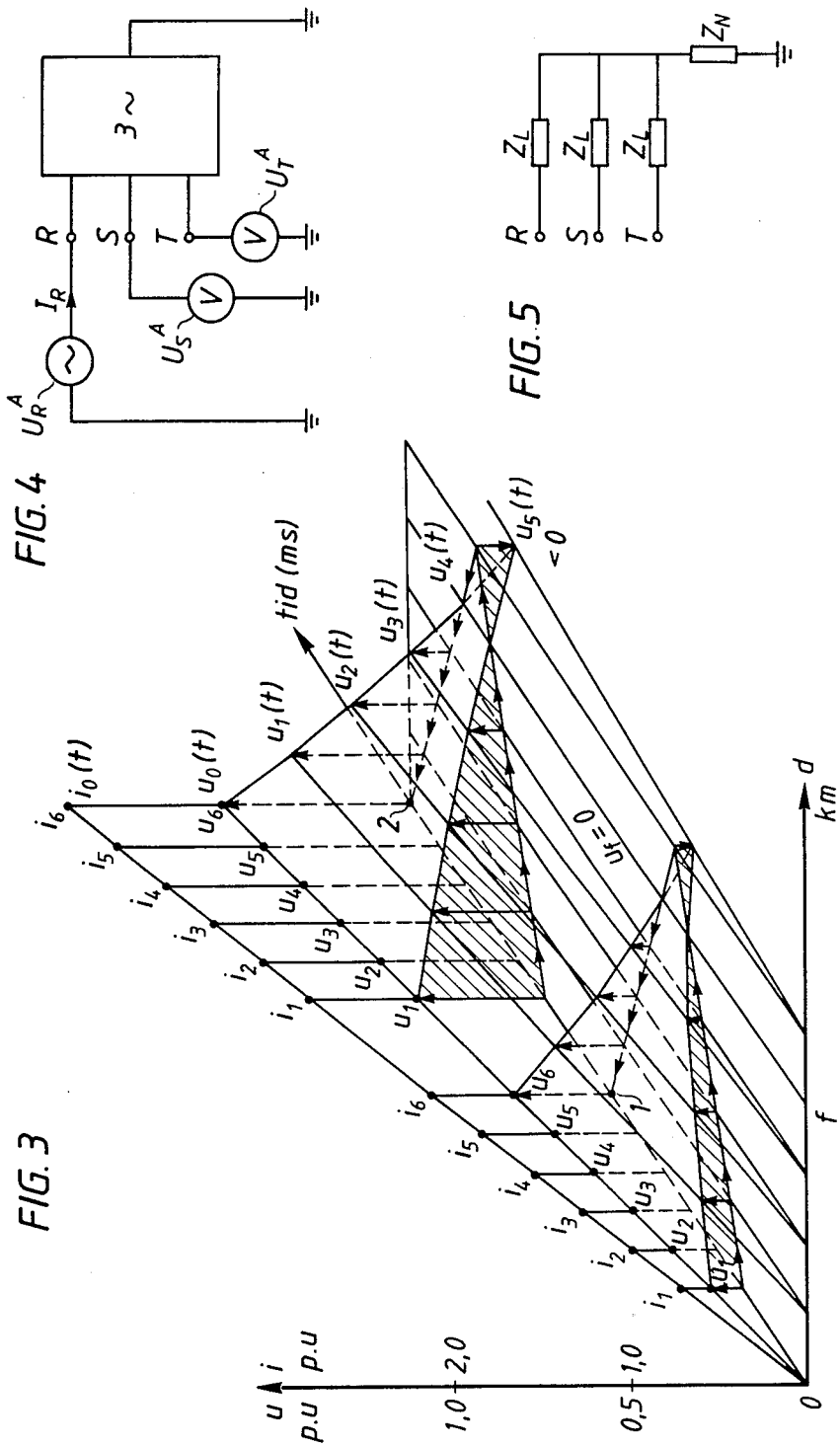

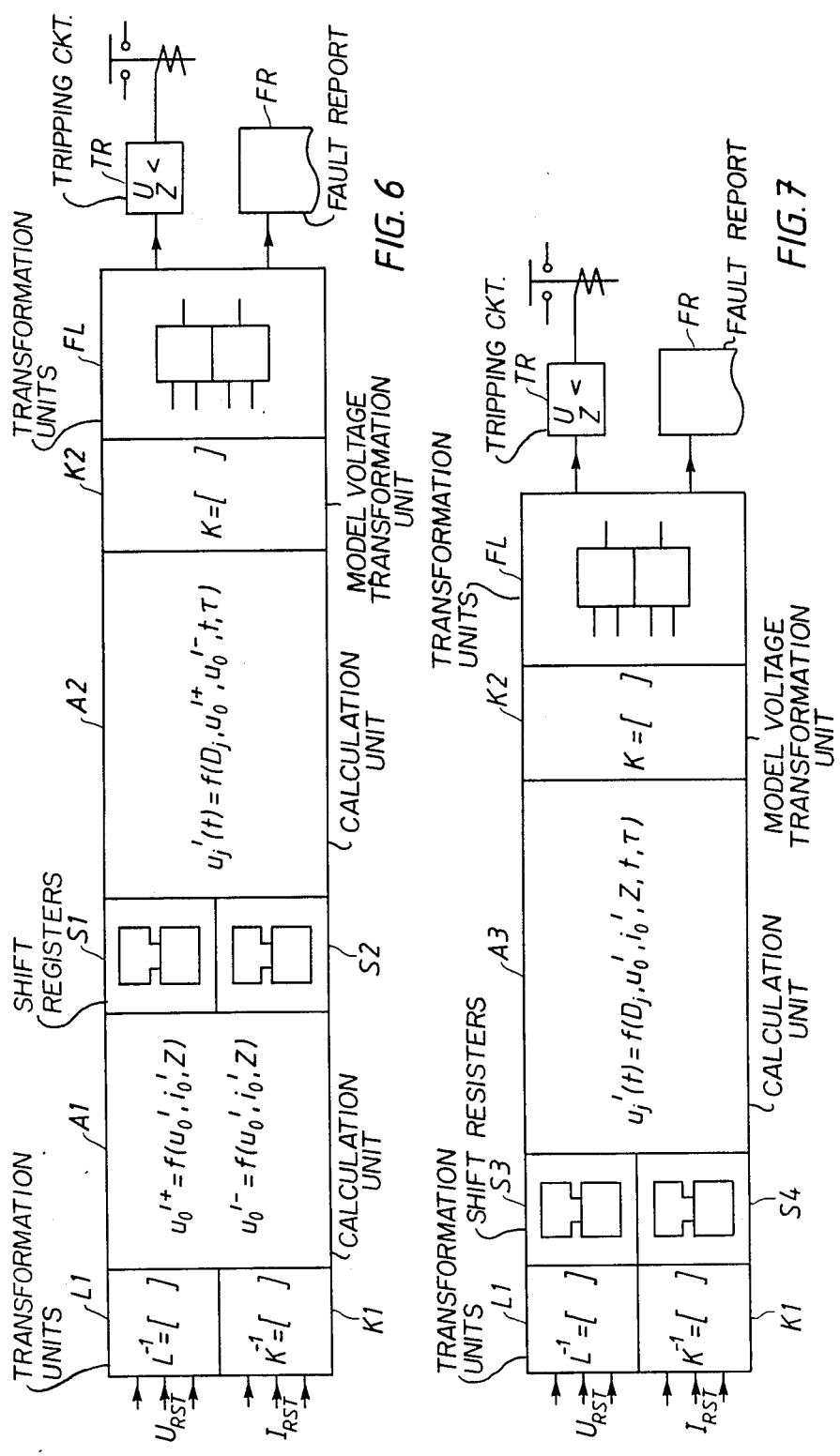

DETECTION AND LOCATION OF A FAULT POINT BASED ON A TRAVELLING WAVE MODEL OF THE HIGH VOLTAGE TRANSMISSION LINE

TECHNICAL FIELD

The present invention relates to a method and a device for distance protection and localization of a fault point on a transmission line based on a model of the line according to the travelling wave theory. The invention comprises carrying out, at certain definite time intervals, a measurement of the instantaneous values of the currents and the voltages at the end point of the transmission line, for example at a station. Based on these measured values and with the aid of travelling wave theory, it is nowadays possible—as a result of the technical developments within the electronics and microprocessor field—to arrive at new solution concepts within the relay protection technique, and particularly for distance protection devices and fault location devices.

PRIOR ART

There are several different methods for fault location on a transmission line. One such method is known in U.S. Pat. No. 4,314,599. This describes a method in which a fault point is assumed and, while making simplified assumptions about the parameters of the network, the current and voltages of the fault point are determined. The determinations are repeated until the current and the voltage have the same phase, which means that the fault point has been located.

Another method is described in Saha' U.S. patent application 528,196, filed Aug. 31, 1983 now U.S. Pat. No. 4,559,491 and assigned to the assignee of this application. This application describes a fault location on a section of a three-phase power line. After measurement of currents and voltages at one end of the section, the type of fault is first determined and thereafter certain parameters in an equation system are determined. This system describes the relationships between the complex values of the impedance of the section, the source impedances at the remote end and at the near end of the network, as well as measured currents and voltages while eliminating the fault resistance, the pre-fault current, the zero sequence components, etc. The solution of the equation system provides the distance from the end point of the section to the fault point in question.

Certain aspects of travelling wave theory have also been employed. For example, U.S. Pat. No. 3,878,460 utilizes the principle in the case of a directional wave detector. By studying the signs of the current and voltage waves, it can be determined whether there is a fault in the monitoring direction of the relay protection device towards the fault point. If this is the case, the current and voltage waves have opposite signs.

This invention relates to a line protection device based on a travelling wave model of a line, which permits fault location for both single-phase and multi-phase systems. The method permits a rapid, accurate and reliable determination of the distance to the fault. In addition, the invention relates to a device for carrying out the method.

What characterizes a method and a device according to the invention will be clear from the appended claims.

BRIEF DESCRIPTION OF DRAWINGS

In the following the invention will be described with reference to the accompanying drawings, in which:

FIG. 3 shows a voltage distribution calculated with the aid of sampled measured current ($i_0$) a voltage ($u_0$) values.

FIG. 4 shows a grounded network with a voltage source connected to the R-phase.

FIG. 5 shows a symmetrical three-phase network.

FIG. 6 shows an example of an analog design of a protection device shown according to the invention.

FIG. 7 shows a different example of an analog design of a protection device according to the invention.

DESCRIPTION OF THE PRINCIPLE OF THE INVENTION

Figure 2:
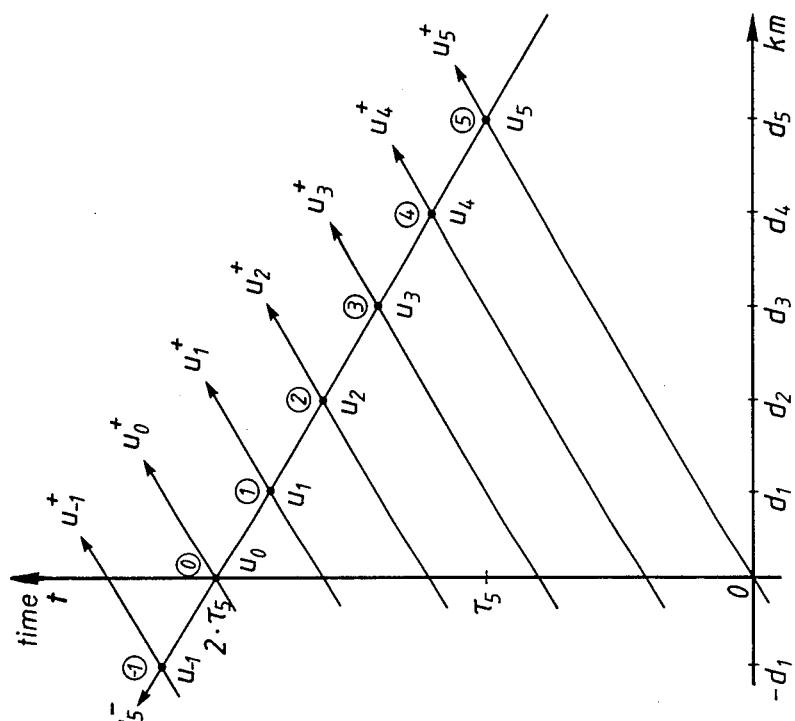
FIG. 2 also shows graphically waves on a transmission line but with alternative control voltages.

In summary the invention, which comprises a method and a device for distance protection and fault location, can be described as follows:

The instantaneous value of current and voltage at the end point of a transmission line is measured, and a certain number of measured values are stored for a certain period of time in a shift register. The shift register is consecutively updated, and the measured values are used to calculate, digitally or analogically, a number of control voltages related to different points along the length of the protected line. The voltage is related to the measuring point $u_0$, calculated voltages are designated $u_1, u_2 \ldots u_n$, and the measured current is designated $i_0$. The voltages $u_1, u_2 \ldots u_n$ are calculated with the aid of formulas derived from the travelling wave theory. This theory states that a wave emanating from the measuring point can be designated $u_0^+ = \frac{1}{2}(u_0 + Z \cdot i_0)$ and the wave arriving at the measuring point can be designated $u_0^- = \frac{1}{2}(u_0 - Z \cdot i_0)$, where Z designates the wave impedance. Somewhere along the transmission line, these waves can be designated $u_j^+(t) = D_j u_0^+(t - \tau_j)$ and $u_j^-(t) = u_0^-(t + \tau_j)/D_j$, respectively, where $D_j$ is the ratio of attenuation of the wave and $\tau_j$ is the transit time. If the transmission line is energized and the calculated control voltage $u_j = u_j^+ + u_j^-$ is constantly zero, there is a fault at point j. Normally, a fault is located between two control points. Characteristic of the control voltages at the points on either side of a fault point is that they have different signs. By interpolation an accurate fault localization can be performed. The invention makes use of suitably chosen matrices for transformation of measured currents and voltages so that transport in shift registers can be carried out in independent modes.

Equations

The theory of travelling waves on transmission lines is described in several text books, inter alia in "Elektricitetslära" by E. Hallén, Uppsala, 1953. The so-called "telegrapher's equation", which is well-known in this connection and the designation of which indicates that the equation was previously used primarily in fields other than power transmission, states that if u = the voltage at a point on the transmission line
i = the current at the same point x = the coordinate of length of the transmission line
r = the resistance per unit of length
l = the inductance per unit of length
g = the conductance per unit of length
c = the capacitance per unit of length
then the following relationships apply:

$$-(\delta u/\delta x) = ri + l(\delta i/\delta t) \quad (1)$$

$$-(\delta i/\delta x) = gu + c(\delta u/\delta t) \quad (2)$$

In the practical application, which will be described here, it can be assumed that the transmission line is distortion-free.
This means that $$rc = gl \quad (3)$$

which permits a very simple solution of the equation systems (1) and (2). With the assumption according to equation (3), the voltage at a point j on the transmission line can be written as $$u_j(t) = u_j^+(t) + u_j^-(t) \quad (4)$$

where
$u_j^+(t)$ is a wave moving in the positive direction of the transmission line and $u_j^-(t)$ is a wave moving in the negative direction.
Further, it is commonly known that the wave velocity $$v = \sqrt{\frac{1}{lc}} \quad (5)$$

and that the wave impedance, with the aid of which the current wave can be expressed, is $$Z = \sqrt{\frac{l}{c}} \quad (6)$$

In the same way as the voltage at a point j, the current at the same point j can be expressed in accordance with equation (4) as $$i_j = i_j^+ + i_j^- \quad (7)$$

where the function dependence on t for simplicity has been omitted.
In addition, the following general equations apply $$i_j^+ = (u_j^+/Z) \quad (8)$$

$$i_j^- = -(u_j^-/Z) \quad (9)$$

which enables the equation (4) to be expressed as $$u_j(t) = 2u_j^+(t) - Zi_j(t) \quad (10)$$

or $$u_j(t) = 2u_j^-(t) + Zi_j(t) \quad (11)$$

When a wave moves along a line, an attenuation of the amplitude is obtained. When the wave has moved from $x = 0$ to $x = d_j$, it has at the same time been attenuated by a factor $$D_j = e^{-\frac{rd_j}{Z}} \quad (12)$$

Starting from the wave velocity according to equation (5), the transit time for the wave from $x = 0$ to $x = d_j$ will be $$\tau_j = d_j \sqrt{lc} \quad (13)$$

The attenuation according to equation (12) and the transit time according to equation (13) permit $u_j^+(t)$ and $u_j^-(t)$ to be written as $$u_j^+(t) = D_j u_0^+(t - \tau_j) \quad (14)$$

and $$u_j^-(t) = \frac{1}{D_j} u_0^-(t + \tau_j) \quad (15)$$

where $u_0^-$ is the voltage related to the measuring point.
From equations (10) and (11), $u_j^+(t)$ and $u_j^-(t)$ can also be written as $$u_j^+(t) = \tfrac{1}{2}[u_j(t) + Zi_j(t)] \quad (16)$$

and $$u_j^-(t) = \tfrac{1}{2}[u_j(t) - Zi_j(t)] \quad (17)$$

With the aid of the measured values of $u_0$ and $i_0$, the voltage at a point at the distance $d_j$ from the measuring point as a function of the time t, i.e., $u_j(t)$, can now be calculated. Parameters in the algorithm for $u_j(t)$ are, besides the time t, the attenuation $D_j$, the transit time $\tau_j$ and the wave impedance Z according to equation (6). The solution is as follows $$u_j(t) = \frac{D_j}{2}[u_0(t - \tau_j) + Zi_0(t - \tau_j)] + \quad (18)$$

$$\frac{1}{2D_j}[u_0(t + \tau_j) - Zi_0(t + \tau_j)]$$

Further, using equations (14) and (15), the equation (4) can be written as $$u_j(t) = D_j u_0^+(t - \tau_j) + \frac{1}{D_j} u_0^-(t + \tau_j) \quad (19)$$

Graphic representation of the movements of the waves

Figure 1:
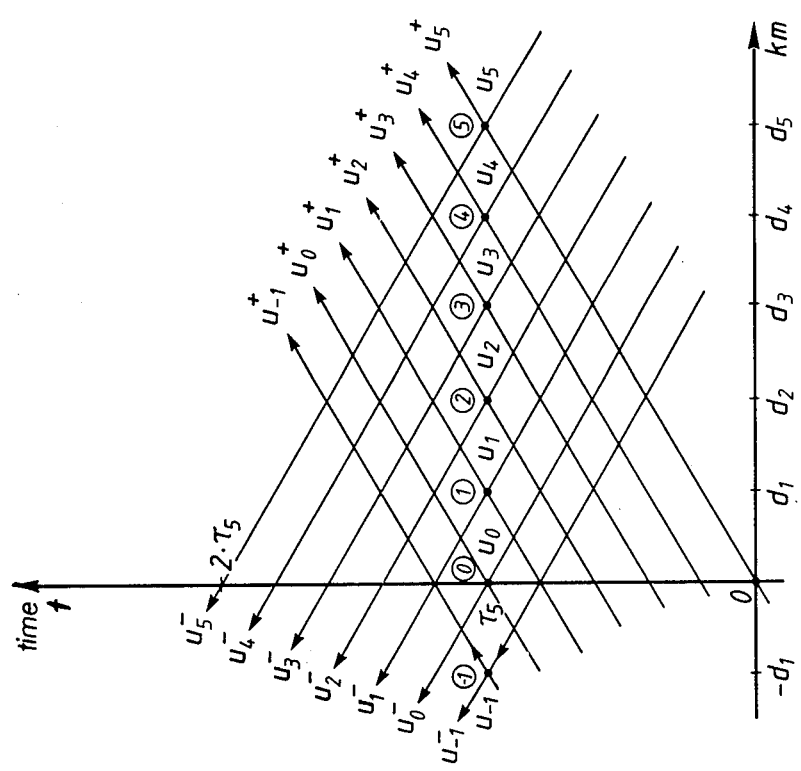
FIG. 1 shows graphically waves on a transmission line and examples of control voltages.

To gain a deeper understanding of the presented theory and thus also of the principle of this invention, we can study FIGS. 1, 2 and 3. On examining the movement of a wave along a transmission line, a time table can be set up. According to equations (5) and (13), the wave velocity is $$v = \sqrt{\frac{1}{lc}} = \frac{d_j}{\tau_j}$$

where, as mentioned, $d_j$ = the distance from the measuring point, for example at a station, to a certain point along the transmission line which has been given the serial number j. Since the velocity is constant, the graph for the movement of the wave is a straight line.

In FIG. 1 the movement for a plurality of waves has been plotted graphically with the distance along the transmission line on the horizontal axis and the time along the vertical axis. The inclination of each line is determined by the wave velocity v.

Starting from time t=0, a number of waves passing the measuring point t=0 in the positive direction have been displayed. These are $u_5^+, u_4^+ \ldots u_0^+$ and $u_{-1}^+$. The time difference between their passage of the measuring point d=0 is $\Delta\tau=\tau_1$, where $\tau_2=2\Delta\tau$, $\tau_3=3\Delta\tau$ and so on. Waves moving in a negative direction, that is $u_{-1}^-, u_0^-, u_1^- \ldots u_5^-$, have also been displayed on the graph.

Since the theory states that the voltage at a point, j, on the transmission line at a certain moment is the sum of the wave in the positive direction $u_j^+$ and the wave in the negative direction $u_j^-$, at each meeting between a wave with a positive direction of movement and a wave with a negative direction of movement, the voltage $u_j$ can be calculated.

Different intersectional points between the $u^+$-waves and the $u^-$-waves may be optionally studied. FIG. 1 shows control voltages which are related to the same point of time. In FIG. 2 it has been chosen to study control voltages related to a certain wave, $u_5^-$, in the negative direction. Also other alternatives are possible.

In FIG. 1 the calculated voltages $u_{-1}, u_0, u_1 \ldots u_5$ serve to keep a check on the voltage that prevails at different points along the transmission line at a certain moment. The condition for $u_{-1} \ldots u_5$ to correspond to actual voltages in the network is that there are no discontinuities between the measuring point, 0, and point j. For j=−1 this condition does not generally apply, since the point 0 lies at the beginning of the transmission line at a station of some kind. Thus, $u_{-1}$ is a fictitious voltage which is used for detection and for distance determination. Several such fictitious voltages could also be conceived, for example $u_{-5}$, which can be used for detecting a fault which lies behind the measuring point of the transmission line.

If a fault has occurred between, for example, points 3 and 4, $u_4$ and $u_5$ will also become purely fictitious voltages, which are still included in the pattern constituted by the control voltages and used by the logic unit of the protection device to determine the condition of the transmission line. The task of the fault detection logic unit is to identify the pattern formed by the control voltages during a sequence of times in order to determine whether a fault has occured and where the fault has occurred. FIG. 3 indicates that the pattern may vary with time, but the voltage at the fault point f is constantly zero. Also, strictly mathematically it can be shown that the sign of fictitious voltages beyond a fault point has been changed. When there is a fault point on the transmission line, this will normally lie between two control points, for example between the control points j and j+1.

Transformations to and from independent modes

The equations stated above apply to single-phase systems. Power lines normally consist of three or possibly more phases. It is well known that a symmetrical multi-phase system can be divided into independent modes. In this way, by suitable transformation, a symmetrical three-phase system can be divided into three single-phase systems which are independent of each other. By applying the previously stated equations to the systems obtained by transformation, the travelling wave model can also be used for calculating the faults for multi-phase systems. For fault analyses and for level sensing, it is often most suitable to use the phase and main voltages of the original multi-phase system. Therefore, an inverse transformation of the modal control voltages back to the original multi-phase system takes place.

Transformations of these kinds are known from a number of publications of various kinds, for example Proceedings IEE 113 (1966): 6 (June) "Study of symmetrical and related components through the theory of linear vector spaces".

Since the utilization of such transformations is included as an integrated part of the method and the device to which this invention relates, a brief summary of the transformation methodology will be described.

FIG. 4 shows an arbitrary network with connection terminals R, S and T and a ground connection. If a voltage $U_R^A$ is connected between terminal R and ground, as shown in the figure, a current $I_R$ will arise. This means that we can define the impedance $$Z_{RR}=(U_R^A/I_R) \tag{20}$$

At the same time, as indicated in FIG. 4, the voltages $U_S^A$ and $U_T^A$ between terminal S and ground and between terminal T and ground can be measured. This makes it possible to define mutual impedances as $$Z_{SR}=(U_S^A/I_R) \tag{21}$$

$$Z_{TR}=(U_T^A/I_R) \tag{22}$$

Now, if the voltage $U_R^A$ is removed and a voltage $U_S^B$ is connected to terminal S, this gives rise to a current $I_S$, and in a corresponding manner a current $I_T$ is obtained when a voltage $U_T^C$ is connected to terminal T. In the same way as for the R-phase, the impedances for S- and T-phases can now be defined:

$$Z_{SS} = \frac{U_S^B}{I_S} \quad Z_{TS} = \frac{U_T^B}{I_S} \quad Z_{RS} = \frac{U_R^B}{I_S} \tag{23}$$

$$Z_{TT} = \frac{U_T^C}{I_T} \quad Z_{RT} = \frac{U_R^C}{I_T} \quad Z_{ST} = \frac{U_S^C}{I_T}$$

Now, if it is assumed that the currents $I_R$, $I_S$ and $I_T$ are simultaneously applied to the respective terminals, according to the superposition theorem the following phase voltages are obtained:

$$U_R = U_R^A + U_R^B + U_R^C$$

$$U_S = U_S^A + U_S^B + U_S^C \tag{24}$$

$$U_T = U_T^A + U_T^B + U_T^C$$

By introducing the above-mentioned impedances, the equation system describing the network can be written as:

$$U_R = Z_{RR}I_R + Z_{RS}I_S + Z_{RT}I_T$$

$$U_S = Z_{SR}I_R + Z_{SS}I_S + Z_{ST}I_T \tag{25}$$

$$U_T = Z_{TR}I_R + Z_{TS}I_S + Z_{TT}I_T$$

which in the matrix form can be written as $$\begin{pmatrix} U_R \\ U_S \\ U_T \end{pmatrix} = \begin{pmatrix} Z_{RR} & Z_{RS} & Z_{RT} \\ Z_{SR} & Z_{SS} & Z_{ST} \\ Z_{TR} & Z_{TS} & Z_{TT} \end{pmatrix} \times \begin{pmatrix} I_R \\ I_S \\ I_T \end{pmatrix} \quad (26)$$

or in reduced form $$U_{RST} = Z_{RST} \times I_{RST} \quad (27)$$

The equation system according to the above can, of course, be solved in conventional manner. In the same way as—in other technical fields—the calculations can be simplified by transformation of equation systems, for example, by Laplace transformation, from a time plane to a frequency plane, also in this case currents and voltages can be transformed so that, on certain conditions, simpler calculations and increased clarity can be achieved.

The transformation of the equation system (25) to modal or independent form implies that we are seeking an equation system $$U_a = Z_a \times I_a$$
$$U_b = Z_b \times I_b \quad (28)$$
$$U_c = Z_c \times I_c$$

where it should be possible to express the parameters included in this system with the aid of the parameters in equation system (25). If such a transformation can be made, we will have obtained three systems which are independent of each other and then the movements of the shift register can be made separately. The conditions and the method for performing such a transformation will be clear from the following:

Let it first be assumed that $I_R$, $I_S$ and $I_T$ are replaced by a linear combination of three currents $I_a$, $I_b$ and $I_c$ which fulfil the following relationships $$I_R = k_{Ra} I_a + k_{Rb} I_b + k_{Rc} I_c$$
$$I_S = k_{Sa} I_a + k_{Sb} I_b + k_{Sc} I_c \quad (29)$$
$$I_T = k_{Ta} I_a + k_{Tb} I_b + k_{Tc} I_c$$

and in the matrix form it can be written as $$\begin{pmatrix} I_R \\ I_S \\ I_T \end{pmatrix} = \begin{pmatrix} k_{Ra} & k_{Rb} & k_{Rc} \\ k_{Sa} & k_{Sb} & k_{Sc} \\ k_{Ta} & k_{Tb} & k_{Tc} \end{pmatrix} \times \begin{pmatrix} I_a \\ I_b \\ I_c \end{pmatrix} \quad (30)$$

or in reduced form $$I_{RST} = K_{abc} \times I_{abc} \quad (31)$$

The same method can be applied to the voltages $U_R$, $U_S$ and $U_T$ and in the matrix form there will be the following:

$$\begin{pmatrix} U_R \\ U_S \\ U_T \end{pmatrix} = \begin{pmatrix} l_{Ra} & l_{Rb} & l_{Rc} \\ l_{Sa} & l_{Sb} & l_{Sc} \\ l_{Ta} & l_{Tb} & l_{Tc} \end{pmatrix} \times \begin{pmatrix} U_a \\ U_b \\ U_c \end{pmatrix} \quad (32)$$

or $$U_{RST} = L_{abc} \times U_{abc} \quad (33)$$

Equation systems (30) and (32) must have a solution. With matrix designations this means that there must be an inverse matrix $(K_{abc})^{-1}$ so that $$I_{abc} = (K_{abc})^{-1} \times I_{RST} \quad (34)$$

and $$U_{abc} = (L_{abc})^{-1} \times U_{RST} \quad (35)$$

where the condition is that $$(K_{abc})^{-1} \times (K_{abc}) = E$$

and $$(L_{abc})^{-1} \times (L_{abc}) = E$$

where E is a unit matrix.

Now, using equations (31) and (33) in equation (27), the result will be:

$$(L_{abc}) \times U_{abc} = Z_{RST} \times (K_{abc}) \times I_{abc} \quad (36)$$

Multiplying both sides by $(L_{abc})^{-1}$ gives $$U_{abc} = (L_{abc})^{-1} \times Z_{RST} \times (K_{abc}) \times I_{abc} \quad (37)$$

Assuming $$M = (L_{abc})^{-1} \times Z_{RST} \times (K_{abc}) \quad (38)$$

the following is obtained $$U_{abc} = M \times I_{abc} \quad (39)$$

On condition that M is given in the form of a diagonal matrix, that is, a matrix of the form $$M = \begin{pmatrix} Z_a & 0 & 0 \\ 0 & Z_b & 0 \\ 0 & 0 & Z_c \end{pmatrix} \quad (40)$$

the equation system (39) can be written as $$U_a = Z_a \times I_a$$
$$U_b = Z_b \times I_b$$
$$U_c = Z_c \times I_c$$

that is, the desired equation system according to equation (28); thus, three systems independent of each other.

With knowledge of $Z_a$, $Z_b$ and $Z_c$, the network according to FIG. 4 can be entirely controlled, and the voltages $U_a$, $U_b$ and $U_c$ and currents $I_a$, $I_b$ and $I_c$ can be calculated.

Starting from a symmetrical three-phase system, it can be shown that
K=L and
$K^{-1}=L^{-1}$, respectively,
that is, $$K \times K^{-1} = K \times L^{-1} = K^{-1} \times L = L \times L^{-1} = E$$

The matrices which are used in this connection are the so-called Clarke's matrices which, if the earlier matrix designations are maintained, are constituted by $$(L_{abc})^{-1} = \begin{pmatrix} \frac{1}{\sqrt{3}} & \frac{1}{\sqrt{3}} & \frac{1}{\sqrt{3}} \\ \sqrt{\frac{4}{6}} & -\frac{1}{\sqrt{6}} & -\frac{1}{\sqrt{6}} \\ 0 & \frac{1}{\sqrt{2}} & -\frac{1}{\sqrt{2}} \end{pmatrix} \quad (41)$$

$$K_{abc} = \begin{pmatrix} \frac{1}{\sqrt{3}} & \sqrt{\frac{2}{3}} & 0 \\ \frac{1}{\sqrt{3}} & -\frac{1}{\sqrt{6}} & \frac{1}{\sqrt{2}} \\ \frac{1}{\sqrt{3}} & -\frac{1}{\sqrt{6}} & -\frac{1}{\sqrt{2}} \end{pmatrix} \quad (42)$$

In a symmetrical three-phase network, equation system (26) can be written as $$\begin{pmatrix} U_R \\ U_S \\ U_T \end{pmatrix} = \begin{pmatrix} Z_1 & Z_2 & Z_3 \\ Z_3 & Z_1 & Z_2 \\ Z_2 & Z_3 & Z_1 \end{pmatrix} \times \begin{pmatrix} I_R \\ I_S \\ I_T \end{pmatrix} \quad (43)$$

Equation (38) can also be written as $$M = N \times (K_{abc}) \quad (44)$$

that is, $$N = (L_{abc})^{-1} \times Z_{RST} \quad (45)$$

With $(L_{abc})^{-1}$ according to equation (41) and $Z_{RST}$ according to equation (43), the following is obtained $$N = \begin{pmatrix} \frac{1}{\sqrt{3}}(Z_1 + Z_3 + Z_2) & \frac{1}{\sqrt{3}}(Z_2 + Z_1 + Z_3) & \frac{1}{\sqrt{3}}(Z_3 + Z_2 + Z_1) \\ \frac{2}{\sqrt{6}}Z_1 - \frac{1}{\sqrt{6}}(Z_3 + Z_2) & \frac{2}{\sqrt{6}}Z_2 - \frac{1}{\sqrt{6}}(Z_1 + Z_3) & \frac{2}{\sqrt{6}}Z_3 - \frac{1}{\sqrt{6}}(Z_2 + Z_1) \\ \frac{1}{\sqrt{2}}(Z_3 - Z_2) & \frac{1}{\sqrt{2}}(Z_1 - Z_3) & \frac{1}{\sqrt{2}}(Z_2 - Z_1) \end{pmatrix} \quad (46)$$

Now, in order for $$M = N \times (K_{abc}) = \begin{pmatrix} Z_a & 0 & 0 \\ 0 & Z_b & 0 \\ 0 & 0 & Z_c \end{pmatrix} \quad (47)$$

then it is presupposed that $$Z_2 = Z_3 \quad (48)$$

which, after certain intermediate calculations, gives $$Z_a = Z_1 + 2Z_2$$
$$Z_b = Z_1 - Z_2 \quad (49)$$
$$Z_c = Z_1 - Z_2$$

Now, looking at a network according to FIG. 5, it can be seen that $$Z_1 = Z_L + Z_N \quad (50)$$

$$Z_2 = Z_3 - Z_N \quad (51)$$

that is, after intermediate calculations $$Z_a = Z_L + 3Z_N$$
$$Z_b = Z_L \quad (52)$$
$$Z_c = Z_L$$

By measurement, $U_R$, $U_S$ and $U_T$ are known, and this provides a possibility of calculating, with the aid of equation (35), the transformed voltage vector $U_0'$ as $U_a$, $U_b$ and $U_c$, that is, $$U_0' = \begin{pmatrix} U_a \\ U_b \\ U_c \end{pmatrix} = (L_{abc})^{-1} \begin{pmatrix} U_{R0} \\ U_{S0} \\ U_{T0} \end{pmatrix} \quad (53)$$

With knowledge of $U_a$, $U_b$ and $U_c$ as well as $Z_a$, $Z_b$ and $Z_c$, it is now possible to calculate $I_a$, $I_b$ and $I_c$ with the aid of $I_{R0}$, $I_{S0}$ and $I_{T0}$. When calculating in the respective independent a-, b- and c-systems, the parameters attenuation, transit time and wave impedance will be designated $D_{ja}$, $\tau_{ja}$, $Z_a$, $D_{jb}$, $\tau_{jb}$, $Z_b$ and $D_{jc}$, $\tau_{jc}$ and $Z_c$, respectively. Phase quantities at the control point can be obtained again by transformation by K (or L), that is, $$U_j = K U_j' = \begin{pmatrix} U_{jR} \\ U_{jS} \\ U_{jT} \end{pmatrix} \quad (54)$$

It is the phase quantities that are most suitable to study. Single-phase faults are indicated by using $U_{jR}$, $U_{jS}$ and $U_{jT}$ individually, which also makes it possible to make phase selections for single-phase tripping. For other types of fault, the respective main voltages are used, that is, $U_{jR}-U_{jS}$, $U_{jS}-U_{jT}$ and $U_{jT}-U_{jR}$.

Embodiments

The protection device can be built in analog or digital technique. Examples of embodiments in analog technique are shown in FIGS. 6 and 7.

In an embodiment according to FIG. 6, transformation of incoming phase voltages $U_{RST}$ and phase currents $I_{RST}$ into modal transformed quantities is carried out in the transformation units L1 and K1 with the matrices $L^{-1}$ and $K^{-1}$, respectively. In this embodiment a calculation is first carried out in the calculating unit A1 of $$U'_0{}^+ = \tfrac{1}{2}(U'_0 + Z \cdot I'_0) \tag{55}$$

and $$U'_0{}^- = \tfrac{1}{2}(U'_0 - Z \cdot I'_0), \tag{56}$$

respectively which values are consecutively stored and updated in the shift registers S1 and S2. A shift register is present for each mode and each wave type, that is, both for voltage waves and current waves. In calculating unit A2 a calculation of $u_j'(t)$ in accordance with equation (19) takes place. The values of the modal voltages $U_a$, $U_b$ and $U_c$ at the selected points, thus obtained, are transformed in transformation unit K2, corresponding to the previously described matrix K, back to phase voltages $U_R$, $U_S$ and $U_T$. These values for each selected point are then supplied to a fault detection logic unit FL for evaluation. From this unit a possible order for tripping via TR and printout of a fault report via FR is given.

FIG. 7 is an embodiment showing the same units L1, K1, K2, FL, TR and FR as in FIG. 6. In the shift registers S3 and S4 the transformed values of $U_0$ and $I_0$ and possibly $I_0 \cdot Z$ are conceived to be stored. In the calculating unit A3 the voltages $U_a$, $U_b$ and $U_c$ at the selected points are now calculated in accordance with equation (18).

Example of embodiment using analog technique

Figure 8:
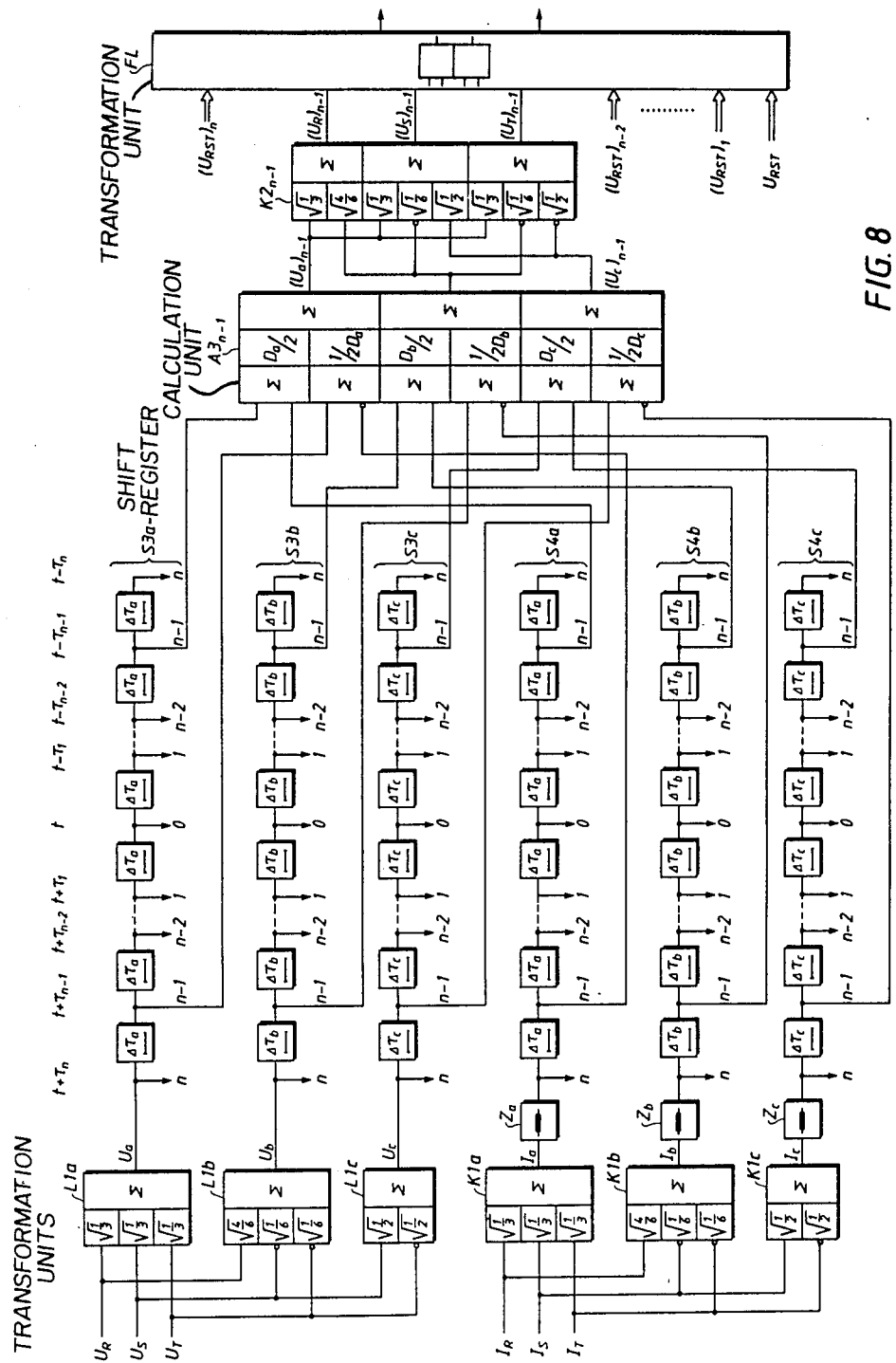
FIG. 8 illustrates a detailed embodiment of a protection device according to the invention in analog design.

FIG. 8 illustrates a more detailed block diagram corresponding to FIG. 7. Transformation of incoming phase voltages $U_{RST}$ and phase currents $I_{RST}$ to modal transformed voltages $U_a$, $U_b$ and $U_c$ and currents $I_a$, $I_b$ and $I_c$ takes place in the matrix units L1a, L1b, L1c and in K1a, K1b, K1c, respectively. As will be clear from FIG. 8 only summing operational amplifiers are required both for the matrix treatment and other calculations.

The modal voltage values are supplied to a shift register S3a, S3b and S3c, and the modal current values are multiplied by the respective modal impedances, whereafter the voltage values are obtained and then supplied to shift registers S4a, S4b and S4c.

If it is assumed that control voltages at n points along the transmission line are to be calculated, the shift register has to be able to store 2n measured values in each mode, corresponding to measurements at times $t-\tau_n$, $T-\tau_{n-1} \ldots t-\tau_1$, $t$, $t+\tau_1 \ldots t+\tau_{n+1}$, $t+\tau_n$. The stored values, related to a certain time t, are now used to calculate the control voltages at this time and the calculations take place according to equation (18). FIG. 8 shows how the calculation at point $n-1$ may be performed. The calculation part $A3_{n-1}$ is thus that part of A3 in FIG. 7 which calculates the voltage at point $n-1$. Corresponding calculation parts exist for each control point. These parts are supplied with input values in the same way as $A3_{n-1}$ from the arrows at n, $n-2$, etc., shown in the Figure.

The calculation part $A3_{n-1}$ gives measured values corresponding to $(U_a)_{n-1}$, $(U_b)_{n-1}$ and $(U_c)_{n-1}$. The corresponding $U_{abc}$ values. For the other control points are available in similar manner. As mentioned previously, however, it is more convenient to determine the parameters of a fault on the basis of the phase quantities in question. Converting to phase quantities is effected, as previously described, by inverse transformation of the calculated control voltages. In FIG. 8 this inverse transformation is described for the control voltages $(U_a)_{n-1}$, $(U_b)_{n-1}$ and $(U_c)_{n-1}$ with the transformation module $K2_{n-1}$, corresponding to the previously described matrix according to equation (42). Also in this case, the transformation can be carried out by using summing amplifiers only. After the transformation, the control voltage at point $n-1$ is now accessible in the form of respective phase voltages $(U_R)_{n-1}$, $(U_S)_{n-1}$ and $(U_T)_{n-1}$.

The calculated voltages $U_a$, $U_b$ and $U_c$ for the other control points are transformed in matrix blocks corresponding to $K2_{n-1}$ into phase quantities (not shown), which means that the fault detection logic unit FL has access to all the phase voltages at all the control points.

Now, if the control voltages at two consecutive points j and k, that is, $u_j(t)$ and $u_k(t)$, constantly have different signs, the conclusion can be drawn that there is a fault between j and k. It is obvious that it is desired to keep the number of control points as low as possible. Problems with the fault location may then arise in those cases where a fault lies near j and when $u_j$ is near zero. A suitable comparison method is the following

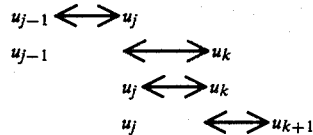

In order quickly to obtain a fault indication, the value of the voltages $u_{-1}$, $u_0$ and $u_n$ is of great value.

If the fault location logic has determined that two consecutive control points j and k are respectively situated on either side of a fault, the value of the control voltages $u_j$ and $u_k$ can be utilized for determining the position of the fault point. If the point j lies at the distance $d_j$ from the measuring station, and if the distance between the control points is $\delta(k-j)$, the formula for calculating the distance from the measuring station to the fault point $d_f$ will be:

$$d_f = d_j + \frac{\delta(k-j)u_j}{u_j - u_k} \tag{57}$$

This is an interpolation method, and for greater accuracy other interpolation methods may be needed.

If the source impedance is smaller than the line impedance, the current at the measuring point will be greater in the case of a near-end line fault than in the case of a busbar fault which is behind the measuring point. The result is that the calculated voltage $u_n$ will be of large magnitude in the case of a near-end fault, whereas in the case of a busbar fault, $u_n$ can never be greater than the operating voltage.

The voltage $$u_n = \frac{1}{2}\left[D_n Zi_0(t - \tau_n) - \frac{1}{D_n} Zi_0(t + \tau_n)\right]$$

can be approximated to $$u_n = Z/2[i_0(t-\tau_n) - i_0(t+\tau_n)]$$

Thus, the value of voltage $u_n$ will be greater if the current change is larger.

In the foregoing, only methods for the fault location logic have been described. Devices for carrying out the method can be constructed in many different ways which, however, are trivial and known per se and therefore not described in this specification.

The distance measuring relay protection device, which has been described above, can be supplemented with a directional wave detector.

What is claimed is:

1. A method for the detection and location of faults on a power transmission line in at least one phase distribution system based on a traveling wave model of the power transmission line, comprising:
   periodically measuring the voltage and current at an end point of the power transmission line;
   determining the wave impedence and the wave attenuation factor of the power transmission line and the transit time of the travelling wave;
   periodically generating signals representative of the measured voltage and current;
   periodically storing the voltage and current signals;
   establishing a number of control points spaced a like number of distances from said end point of the power transmission line along said power transmission line;
   calculating a control voltage ($u_1, u_2 \ldots u_j \ldots u_n$) at each of said number of control points along said power transmission line from the following formula:

$$u_j(t) = D_j/2\{u_0(t-T_j) + Zi_0(t-T_j)\} + 1/2D_j\{u_0(t+T_j) - Zi_0(t+T_j)\}$$

where
   $D_j$ = said attenuation factor of a wave travelling along said power transmission line;
   $T_j$ = the determined transit times of the travelling wave;
   $u_0$ = the measured voltage at said end point of said power transmission line;
   $i_0$ = the measured current at said end point of said power transmission line; and
   $Z$ = the determined wave impedance of said power transmission line;
   determining faults as those locations on said power transmission line where the associated calculated control voltage is constantly zero; and
   generating output signals representative of the fault locations to provide an indication thereof.

2. A method as claimed in claim 1, in which faults are located by monitoring the control voltages at two consecutive control points constantly having different signs, determining faults on the power transmission line as being located between any such two points from the following formula:

$$d_f = d_j + \delta(u-j)u_j/u_j - u_k$$

where $d_f$ is the distance from the end point of said power transmission line; $d_j$ is the distance from the end point of said power transmission line to one of said control points having a different sign; (u−j) is the distance between the control points having different signs; and $u_j$ and $u_k$ are the control voltages having respective different signs.

3. A method according to claim 2, in which for an at least three-phase system, the measured current and voltage values are transformed to independent model values, the independent modal values are stored and the control voltages are calculated using the stored independent modal values.

4. A method according to claim 3, in which the modally calculated voltages are transformed by inverse transformation to respective phase voltages.

5. A method according to claim 1 in which in calculating the control voltages use is made of current and voltage values measured at the times $t+\tau_k$ and $t-\tau_k$, where $\tau_k$ is the transit time of a wave on the transmission line from the measuring point to the control point k, with k assuming values from 0 to n.

6. A method according to claim 2, in which in calculating the control voltages use is made of current and voltage values measured at the times $t+\tau_k$ and $t-\tau_k$, where $\tau_k$ is the transit time of a wave on the transmission line from the measuring point to the control point k, with k assuming values from 0 to n.

7. A method according to claim 1, in which for an at least three-phase system, the measured current and voltage values are transformed to independent modal values, the independent modal values are stored, and the control values are calculated using the stored independent modal values.

8. A method according to claim 7, in which the modally calculated voltages are transformed by inverse transformation to respective phase voltages.

9. A device for the detection and location of faults on a power transmission line in at least one phase distribution system based on a traveling wave model of the power transmission line from measured voltage and measured current at an end point of the power transmission line, the predetermined wave impedance of the power transmission line, the predetermined wave attenuation factor and transit time based on said travelling wave model of the power transmission line, comprising:
   means for periodically generating signals representative of the measured voltage and current;
   means for periodically storing the voltage and current signals;
   means for calculating a control voltage ($u_1, u_2 \ldots u_j \ldots u_n$) at each of a number of predetermined control points spaced a like number of distances from said end point of the power transmission line along said power transmission line from the following formula:

$$u_j(t) = D_j/2\{u_0(t-T_j) + Zi_0(t-T_j)\} + 1/2D_j\{u_0(t-T_j) - Zi_0(t+T_j)\}$$

where $u_j$ = said predetermined attenuation factor of a wave travelling along said power transmission line;

$T_j$ = said predetermined transit time of the travelling wave;

$u_0$ = the measured voltage at said end point of said power transmission line;

$i_0$ = the measured current at said end of said power transmission line;

Z = said predetermined wave impedance of said power transmission line; and means for determining faults as those locations on said power transmission line where the associated calculated control voltage is constantly zero; and means for generating output signals representative of the fault locations to provide an indication thereof.

10. A device according to claim 9, wherein said means for receiving the measured voltage and current information are means for transforming the voltage and current information to modal quantities and said means for storing are shift registers for storing said modal quantities for both current and voltage, and further comprising means for transforming said calculated control voltages to phase voltages, and fault detection logic circuity responsive to said phase voltages for determining whether a fault exists and for determining the distance to a fault from the point at which said voltage and currents are measured.

11. A device according to claim 10 in which the fault detection logic unit is constructed as an analog unit.

12. A device according to claim 10 in which the fault detection logic unit is constructed as a digital unit.

* * * * *